United States Patent [19]

Chan

[11] Patent Number: 5,854,573
[45] Date of Patent: Dec. 29, 1998

[54] LOW-VOLTAGE MULTIPATH-MILLER-ZERO-COMPENSATED CMOS CLASS-AB OPERATIONAL AMPLIFIER

[75] Inventor: Pak Kwong Chan, Singapore, Singapore

[73] Assignee: Institute of Microelectronics National University of Singapore, Singapore

[21] Appl. No.: 729,916

[22] Filed: Oct. 15, 1996

[30] Foreign Application Priority Data

May 16, 1996 [SG] Singapore ............................ 9609131-9

[51] Int. Cl.$^6$ ...................................................... H03F 1/14
[52] U.S. Cl. ........................ 330/292; 330/107; 330/151; 330/260; 330/294
[58] Field of Search ................................ 330/76, 77, 107, 330/151, 255, 260, 292, 294, 310

[56] References Cited

U.S. PATENT DOCUMENTS

| | | | |
|---|---|---|---|
| 4,559,502 | 12/1985 | Huijsing | 330/294 |
| 5,155,447 | 10/1992 | Huijsing et al. | 330/294 X |
| 5,485,121 | 1/1996 | Huijsing et al. | 330/292 X |

OTHER PUBLICATIONS

R.G.H. Eschauzier and J.H. Huijsing, "An Operational Amplifier with Multipath Miller Zero Cancellation for RHP Zero Removal", 19th ESSCIRC, pp. 122–125, Sep. 1993.

J.E. Solomon, "The Monolithic Op Amp: A Tutorial Study", IEEE J. Solid–State Circuits, vol. SC–9, No. 6, pp. 314–332, Dec. 1974.

B.K.Ahuja, "An Improved Frequency Compensation Technique For CMOS Operational Amplifiers", IEEE J. Solid–State Circuits, vol. SC–18, No. 6, pp. 629–633, Dec. 1983.

Y.P. Tsividis and P.R. Gray, "An Integrated NMOS Operational Amplifier With Internal Compensation", IEEE J. Solid–State Circuits, vol. SC–11, pp. 748–754, Dec. 1976.

W.C. Black, D.J. Allstot, and R.A.Reed, "A High Performance Low Power CMOS Channel Filter", IEEE J. Solid–State Circuits, vol. SC–15, No. 6, pp. 929–938, Dec. 1980.

P.R. Gray and R.G. Meyer, "MOS Operational Amplifier Design —A Tutorial Overview", IEEE J. Solid–State Circuits, vol. SC–17, No. 6, pp.969–982, Dec. 1982.

R.G.H. Eschauzier, R. Hogervorst and J.H. Huijsing, "A Programmable 1.5V CMOS Class–AB Operational Amplifier With Hybrid Nested Miller Compensation for 120 dB Gain and 6 MHZ UGF", IEEE International Solid–State Circuits Conference, pp. 246–247, Feb. 1994.

R. Hogervorst, J.P. Tero, R.G.H. Eschauzier and J. H. Huijsing "A Compact Power—Efficient 3V CMOS Rail–To– Rail Input/Output Operational Amplifier For VLSI Cell Libraries", IEEE International Solid–State Circuits Conference, pp. 244–245, Feb. 1994.

S.N. Filho, M.C. Schneider and R.N.G. Robert, "New CMOS OTA For Fully–Integrated Continuous–Time Applications", Electronics Lett., vol. 25, No. 24, pp. 1674–1675, Nov. 1989.

L.G.A. Callewaert and W.M.C. Sansen, "Class–AB CMOS Amplifier With High Efficiency", IEEE J. Solid–State Circuits, vol. SC–25, No. 3, pp.684–691, Jun. 1990.

*Primary Examiner*—James B. Mullins
*Attorney, Agent, or Firm*—Meltzer, Lippe, Goldstein, Wolf & Schlissel, P.C.

[57] ABSTRACT

A low-voltage multipath-miller-zero-compensated operational amplifier is disclosed which includes a class AB front stage and a class AB back stage. The front stage has an inverted input, a non-inverted input, an inverted output, and a non-inverted output. The back stage has an output and input, which input is connected to the non-inverted output of the front stage. The output of the back stage is connected to the inverted output of the front stage. A capacitor is coupled in a feedback loop between the output and inverted input of the back stage. An operational amplifier in accordance with the present invention is particularly well-suited for use in switched-capacitor filters, continuous-time filters, microwave medical applications and general purpose amplification applications.

11 Claims, 13 Drawing Sheets

LOW-VOLTAGE MULTIPATH-MILLER-ZERO-COMPENSATED CMOS CLASS-AB OPERATIONAL AMPLIFIER

FIELD OF THE INVENTION

The present invention relates generally to multipath-miller-zero-compensated (MMZC) operational amplifiers which may be implemented using complementary metal-oxide-semiconductor (CMOS) devices, and more particularly to low-voltage MMZC operational amplifiers which include one or more class AB amplifier stages.

BACKGROUND OF THE INVENTION

Operational amplifiers (op amps) are often used to amplify signals. Op amps may have multiple stages to increase the overall gain of the op amp, i.e., to increase the overall amplification of an input signal. FIG. 1 shows a block diagram of a typical op amp 10 having two stages $A_1$ and $A_2$. The front stage $A_1$ of the op amp may be a differential amplifier having a non-inverting input 12 and an inverting input 14. The output 16 of the front stage $A_1$ is connected to an input 18 of the back stage $A_2$. The output 20 of the back stage $A_2$ is the output of the op amp 10. A load $Z_L$ is connected to the output 20. The load $Z_L$ may be a resistor $R_L$, a capacitor $C_L$, an inductor $L_L$ or a combination thereof. Output signals from op amps generally have a phase which lags behind the phase of the input signals. A phase lag of greater than 180° causes oscillation. To prevent oscillation and provide stability, a feedback loop 22 connects together the output 20 and input 18 of the back stage $A_2$.

In the exemplary op amp 10 of FIG. 1, the front stage $A_1$ is implemented as a class A amplifier and the back stage $A_2$ is implemented as a class AB amplifier. Class A amplifiers are biased to allow a full sinusoidal input signal to be reproduced at the output. The conduction angle of a class A amplifier is 360° so that a sinusoidal input signal is fully reproduced from 0° to 360°. Class A amplifiers have low distortion but generally have a poor efficiency. For example, a class A amplifier may have an efficiency as low as 50% for sinusoidal signal inputs.

To increase efficiency, class B amplifiers may be used. Class B amplifiers conduct only during half of an input cycle. That is, the conduction angle of a class B amplifier is 180°. Thus, only half the input cycle, e.g., from 0° to 180°, appears at the output. Two Class B amplifiers connected in a push-pull configuration are required to output to entire input cycle. Although class B amplifiers generally have high efficiency, such amplifiers may produce significant output signal distortion. To achieve a compromise between efficiency and distortion, class AB amplifiers are often used. Class AB amplifiers have a conduction angle between 180° and 360°. As in class B amplifiers, class AB amplifiers have two output transistors connected in a push-pull arrangement.

Two dominant poles $f_1$, $f_2$ determine the frequency response of the two stage op amp 10 of FIG. 1. A representative transfer function of the two stage op amp 10 is given by equation (1):

$$A(jf) = \frac{A_o}{\left[1+j\left(\frac{f}{f_{p1}}\right)\right]\left[1+j\left(\frac{f}{f_{p2}}\right)\right]} \qquad (1)$$

The magnitude in decibel (dB) of the transfer function shown in equation (1) is given by equation (2):

$$|A|(dB) = 20\log|A_o| - \qquad (2)$$
$$20\log\sqrt{1+\left(\frac{f}{f_{p1}}\right)^2} - 20\log\sqrt{1+\left(\frac{f}{f_{p2}}\right)^2}$$

A plot of the amplitude and phase of the transfer function A(jf) versus frequency is referred to as a Bode plot. FIG. 2a shows two Bode magnitude plots 30, 40. The first Bode plot 30 shows the magnitude of the voltage gain $A_v$ of the op amp 10 on the vertical axis 32 versus frequency on the horizontal axis 34. At $f_u$, the frequency at which the Bode plot 30 crosses the horizontal axis 34, the value of the gain is unity (or 0 dB). Each pole causes the frequency response to fall off by 6 dB/octave (or 20 dB/decade). Thus, between the poles $f_1$, $f_2$, the frequency response decreases by 6 dB/octave, and after pole $f_2$, the frequency response decreases by 12 dB/octave (or 40 dB/decade).

FIG. 2b is a phase-response Bode plot which shows a plot 35 of the phase angle φ associated with the Bode plot 30 of FIG. 2a. The vertical axis 36 is the phase angle φ of the output signal and the horizontal axis 34 is frequency. The op amp becomes stable when the phase angle φ is less than −180°, i.e., when the output lags the input by more than 180°. FIG. 2b shows the phase margin y which is a measure of the stability of an op amp. Phase margin y is the amount of additional phase lag at frequency $f_u$ required to bring the op amp to the verge of instability, where the phase angle φ equals −180°. The phase margin y is calculated by equation (3):

$$y = 180° + \phi \qquad (3)$$

It is desirable to have a large phase margin y and a single pole frequency response. The single pole frequency response limits the frequency response roll off to 6 dB/octave from DC to $f_u$. A pole-splitting technique may be used to provide an approximate single pole frequency response in a 2-stage op amp. Pole splitting moves the two dominant poles $f_1$, $f_2$ further apart. The dashed lines in FIG. 2a correspond to the second Bode plot 40 in which the first dominant pole $f'_1$ and the unity gain frequency $f'_u$ are shifted to the left, and the second dominant pole $f'_2$ is shifted to the right. The shifted second pole $f'_2$ is at higher frequency than the shifted unity gain frequency $f'_u$. Therefore, as desired, the Bode plot 40 roles off by no more than about 6 dB/octave between DC and $f'_u$.

Miller effect compensation is another conventional op amp compensation technique which creates an approximate single pole frequency response. This response is achieved by adding a compensation capacitor $C_c$ in the feedback loop 22 of FIG. 1. FIG. 3 shows a single-capacitor Miller-compensated op amp 50. The op amp 50, which is similar to the op amp 10 of FIG. 1, has the compensation capacitor $C_c$ in the feedback loop 52. Hereinafter, for simplicity, the load connected to the output of an op amp will be shown as a capacitor $C_L$. However, it should be understood that any type of load may be connected to the output of an op amp.

An input signal with an amplitude of $V_{in}$ volts is applied to the inputs 12, 14 of the front stage $A_1$. The front stage $A_1$ amplifies the input signal and provides at its output 16 an intermediate signal having an amplitude of $A_{v1}V_{in}$, where $A_{v1}$ is the voltage gain of the front stage $A_1$. The intermediate signal is provided to the input 18 of the back stage $A_2$ which has a voltage gain of $A_{v2}$. The amplitude of the op amp output 20, which is also the output of the back stage $A_2$, is $V_o = A_v V_{in}$, where $A_v = (A_{v1})(A_{v2})$.

The front stage $A_1$ is basically a transconductance amplifier, i.e., a voltage-to-current converter. The compensating capacitor $C_c$ and the back stage $A_2$ integrate the current provided from the front stage $A_1$. Thus, the back stage $A_2$ acts as a current-to-voltage converter. The overall op amp 50 thereby provides voltage amplification.

The compensation capacitor $C_c$ provides a direct feedforward path from the input 18 to the output 20 of the second stage $A_2$. This adds a right-hand-plane (RHP) zero. Locating the RHP zero at a high frequency increases the phase margin and allows for stable high frequency operation of the op amp. The voltage gain $A_v$ of the op amp 50, is given by equation (4):

$$A_v = \frac{g_m R_L \left(1 + j\frac{f}{f_z}\right)}{\left(1 + j\frac{f}{f_{p1}}\right)\left(1 + j\frac{f}{f_{p2}}\right)} \quad (4)$$

where:

$g_m$ is the transconductance of a transistor used to implement the op amp;

$R_L$ is a load resistor;

$f_z$ is a zero; and $f_{p1}$, $f_{p2}$ are first and second poles, respectively.

For bipolar devices, $g_m$ is large thus allowing the RHP zero to be positioned over the second pole which is located at a high frequency. However, for MOS devices, the relatively low value of $g_m$ prevents the RHP zero from being located at high enough frequencies. Therefore, the RHP zero cannot be positioned over the high frequency second pole. The inability to place the RHP zero over the second pole degrades the phase margin and stability of the op amp.

To improve the stability of the op amp 50, many solutions have been proposed. FIG. 4 shows one solution, referred to as RC Miller compensation. As shown in FIG. 4, an op amp 60 has a series connected $R_c C_c$ network in the feedback loop 62. The resistor $R_c$ allows independent control over the location of the RHP zero.

The RHP zero is commonly placed at infinity by setting the compensation resistor value $R_c$ to equal the reciprocal of the transconductance of the second stage $g_{m2}$. This solution is described in:

[1] P. R. Gray and R. G. Meyer, "MOS Operational Amplifier Design—A Tutorial Overview", IEEE J. Solid-State Circuits, Vol. SC-17, No. 6, pp. 969–982, December 1982, which is incorporated herein by reference.

Alternatively, the compensation resistor value $R_c$ is chosen to move the zero from the RHP to the LHP (left-hand-plane) and to locate the resultant LHP zero over the second LHP pole. This is referred to doublet compensation and is described in:

[2] W. C. Black, D. J. Allstot, and R. A Reed, "A High Performance Low Power CMOS Channel Filter", IEEE J. Solid-State Circuits, Vol. SC-15, No. 6, pp. 929–938, December 1980, which is incorporated herein by reference.

Doublet compensation effectively cancels the second LHP pole and thereby increases the phase margin. The phase margin is increased because the LHP zero causes a phase lead which cancels a phase lag caused by the LHP pole. However, during use, the matched pole and zero may become separated, for example, due to process and temperature variations. This necessitates use of a compensation tracking circuit to improve the pole-zero matching. The compensation tracking circuit increases the complexity and size of the op amp. In addition, a doublet compensated op amp requires a relatively high voltage to provide sufficient gate bias to transistors operating in the non-saturation region and used as an active RC network in the feedback loop of the op amp. Therefore, a doublet compensated op amp generally cannot be operated at low voltages. In addition, the phase margin of the amplifier is strongly dependent on the capacitive load. The amplifier therefore may become overcompensated in the case of light capacitive loads, thereby decreasing the gain margin.

Another solution to improve the stability of an op amp uses a unity gain buffer or a current buffer. FIG. 5 shows a unity-gain buffer compensated op amp 70 having a feedback loop 72 between the output 20 and input 18 of the second stage $A_2$. The output 20 is fed into a unity gain buffer 74. The output 76 of the unity gain buffer 74 is connected to the input 18 of the second stage $A_2$ through the compensation capacitor $C_c$. Unity-gain buffer compensated op amps are discussed in:

[3] Y. P. Tsividis and P. R. Gray, "An Integrated NMOS Operational Amplifier With Internal Compensation", IEEE J. Solid-State Circuits, Vol. SC-11, pp. 748–754, December 1976, which is incorporated herein by reference.

FIG. 6 shows a two stage current buffer compensated op amp 80 where the compensation capacitor $C_c$ is in the feedback loop 82 between the input 18 and output 20 of the second stage $A_2$. A current buffer 84 is connected between the first and second stages $A_1$, $A_2$. The current buffer 84 includes a MOS device 86. Current sources 87, 88 are connected to the drain 89 and source 90, respectively, of the MOS device 86 to provide a bias current $I_{bias}$.

The output 16 of the first stage $A_1$ is connected to the drain 89 of the MOS device 86. The source 90 of the MOS device 86 is connected to the input 18 of the second stage $A_2$. The gate 92 of the MOS device 86 is connected to ground. Current buffer compensated op amps are discussed in:

[4] B. K. Ahuja, "An Improved Frequency Compensation Technique For CMOS Operational Amplifiers", IEEE J. Solid-State Circuits, Vol. SC-18, No. 6, pp. 629–633, December 1983, which is incorporated herein by reference.

Both the unity gain buffer 74 of FIG. 5 and the current buffer 84 of FIG. 6 block the feedforward path while allowing high frequency AC output current flow from the output 20 of the second stage $A_2$ into the output 16 of the first stage $A_1$. The feedforward path is from the output 16 of the first stage $A_1$ to the output 20 of the second stage $A_2$ through the feedback loop. This effectively eliminates the RHP zero by shifting it to infinity or a very high frequency, such that it introduces at most a negligible phase shift. However, it is often difficult to "tame" the class AB push-pull amplifier of the back stage $A_2$ of these op amps because of peaking of the output at large quiescent bias conditions. The peaking effect causes undesirable bumps in the frequency response at the output 20 of the op amp. These bumps are manifested in an increase in the open loop gain response as a function of frequency near the roll-off frequency. The peaking effect is discussed in the following two references:

[5] J. E. Solomon, "The Monolithic Op Amp: A Tutorial Study", IEEE J. Solid-State Circuits, Vol. SC-9, No. 6, pp. 314–332, December 1974; and

[6] R. G. H. Eschauzier and J. H. Huijsing, "An Operational Amplifier with Multipath Miller Zero Cancellation for RHP Zero Removal", 19th ESSCIRC, pp. 122–125, September 1993.

These references are incorporated herein by reference. This Eschauzier reference [6] discloses a class A folded-cascode front-end stage.

To avoid the peaking effect, the Eschauzier reference [6] discloses a multipath Miller zero compensated op amp similar to the op amp 100 shown in FIG. 7. As shown in FIG. 7, the front-end gain stage amplifier A'$_1$ has a dual output; a non-inverted output 102 and an inverted output 104. The non-inverted output 102 is connected to the input 18 of the back gain stage A$_2$. One feedback loop 106 connects the output 20 of the back stage A$_2$ to its input 18 through the compensation capacitor C$_c$. A second feedback loop 108 connects the output 20 to the inverted output 104 of the front stage A'$_1$.

The second feedback loop 108 produces zero cancellation by providing an anti-phase path to the inverted output 104. The inverted output 104 serves to source/sink the output current of the front stage A'$_1$. Therefore, no feedforward AC current is injected into an output load C$_L$ connected to the output 20 of the op amp 100. The zero is thus moved to infinity.

Low-voltage class AB multi-stage op amps are traditionally implemented using a class A amplifier as the front-end stage A$_1$, and a class AB amplifier as the back-end stage A$_2$. Such an implementation using a class A front stage is discussed in the following two reference:

[7] R. G. H. Eschauzier, R. Hogervorst and J. H. Huijsing, "A Programmable 1.5V CMOS Class-AB Operational Amplifier With Hybrid Nested Miller Compensation for 120 dB Gain and 6 MHZ UGF", IEEE International Solid-State Circuits Conference, pp. 246–247, February 1994; and

[8] R. Hogervorst, J. P. Tero, R. G. H. Eschauzier and J. H. Huijsing, "A Compact Power-Efficient 3V CMOS Rail-To-Rail Input/Output Operational Amplifier For VLSI Cell Libraries", IEEE International Solid-State Circuits Conference, pp. 244–245, February 1994.

These references are incorporated herein by reference. This Eschauzier reference [7] discloses a class A folded-single-mirror front-end stage.

The slew rate of an op amp generally refers to the time rate of change of a closed loop amplifier output voltage. To reduce output signal distortion, it is desirable to have a high slew rate. The slew rate of op amps using class A front stage amplifiers is limited by the finite output current driving capability of the front-end class A stage. The limited slew rate prevents proper operation of the op amp at high frequencies for input signals having a large amplitude.

FIG. 8 shows a CMOS implementation of a conventional CMOS current op amp 110 discussed in:

[9] S. N. Filho, M. C. Schneider and R. N. G. Robert, "New CMOS OTA For Fully-Integrated Continuous-Time Applications", Electronics Lett., Vol. 25, No. 24, pp. 1674–1675, November 1989, which is incorporated herein by reference.

The CMOS current op amp 110 has a front stage and a back stage. The front stage is a class AB transconductance amplifier formed by CMOS transistors M1–M10, while the back stage is a class AB amplifier formed by a push-pull complementary pair of CMOS transistors M11, M12. The gain of the front stage transconductance amplifier is set to one for stability considerations. Most of the gain of the CMOS current op amp 110 is provided by the back stage push-pull complementary pair of CMOS transistors M11, M12.

The class AB transconductance amplifier (i.e., the front stage) of the CMOS current op amp 110 has a differential amplifier formed by PMOS transistors M1 and M2. The gates 112, 114 of M1 and M2 receive non-inverted and inverted inputs $V_{in}^+, V_{in}^-$, respectively. The source 116 of M1 is connected to a PMOS current mirror M3, M4, and the source 118 of M1 is connected to a PMOS current mirror MS, M6.

The typical connection of a current mirror, such as the current mirror M5, M6, is as follows. The gate 120 of the PMOS transistor M4 is connected to the gate 122 and drain 124 of the PMOS transistor M3. The drain 124 of M3 is in turn connected to an NMOS current mirror M7, M8. In particular, the drain 124 of M3 is connected to the drain 126 of M7. The gate 128 of M7 is connected to the gate 130 and source 132 of M8.

The drain 140 of M1 is connected to the source 132 of M8 and the drain 142 of M2 is connected to another NMOS current mirror M9, M10 in a similar fashion as the connection of the NMOS current mirror M7, M8 to the drain 140 of M1. The source 118 of M2 is also connected to the PMOS current mirror M5, M6 in a similar fashion as the connection of the PMOS current mirror M3, M4 to the source 116 of M1.

The gate 112 of M1 is connected to a unity gain buffer amplifier 152 and the gate 114 of M2 is connected to a unity gain buffer amplifier 156. The outputs of the unity gain buffer amplifiers 156, 152 are connected to the sources 116, 118 of M1, M2, respectively.

The interconnected gates 120, 122 of the current mirror M3, M4 are connected to the gate 170 of an NMOS transistor M12 which is connected in a push-pull configuration with an NMOS transistor M11. That is, the drain 172 of M12 is connected to the drain 174 of M11. The interconnected drains 172, 174 of M12, M11 provide the output of the transconductance amplifier 110 which is an amplified current I$_o$ given by:

$$I_o = g_m(V_{in}^+ - V_{in}^-) \quad (5)$$

The interconnected gates 128, 130 of the current mirror M7, M8 are connected to the gate 175 of M11. The sources 180, 182, 184, 186 of the current mirrors M3, M4, and M5, M6, and the source 188 of M12 are connected to Vdd. The sources 190, 192, 194, 196 of the current mirrors M7, M8, and M9, M10, and the source 198 of M11 are connected to ground.

FIG. 9a shows another conventional class AB op amp 200 discussed in:

[10] L. G. A. Callewaert and W. M. C. Sansen, "Class-AB CMOS Amplifier With High Efficiency", IEEE J. Solid-State Circuits, Vol. SC-25, No. 3, pp. 684–691, June 1990, which is incorporated herein by reference.

The op amp 200 is a class AB transconductance amplifier which is implemented with CMOS transistors and has a dual stage design. FIG. 9b shows one of the dual stages which is the half of the op amp 200 enclosed in the dotted lines of FIG. 9a. As shown in FIG. 9b, a differential input pair M1A, M1B receives non-inverted and inverted inputs $V_{in}^+, V_{in}^-$. The drains 210, 212 of the differential input pair M1A, M1B are connected to a current mirror M4A, M4B. The sources 220, 222 of the differential input pair M1A, M1B are connected to a current source 230 which provides a biasing current I$_{bias}$. A feedback loop is formed by the folded-cascode transistor M3 and the current mirror M4A, M4B. Another current source 240, which also provides I$_{bias}$, is connected to the source 242 of the transistor M3. Transistor M4C has its gate 250 connected to the gates 254, 256 of the current mirror M4A, M4B. The drain 260 of the transistor M4C is connected to the output 270 of the op amp 200 (see also FIG. 9a).

Alternatively, instead of the op amp 200 of FIG. 9a, which is implemented with two of the op amps shown in FIG. 9b, another realization of a class AB op amp discussed in Callewaert uses the op amp shown in FIG. 9b plus a current mirror.

The class AB op amps shown in FIGS. 8, 9a and 9b are typically used as the back stages of conventional op amps, while the front stages are implemented using class A amplifiers. Conventional op amps that have a class A front stage and a class AB back stage suffer from limited slew rate, peaking of the output signal, and sensitivity to process and temperature variations.

In view of the foregoing, it is an object of the present invention to provide a low-voltage multipath-miller-zero-compensated op amp which overcomes the shortcomings of the prior art op amps.

Specifically, it is an object of the present invention to provide a low-voltage multipath-miller-zero-compensated op amp which has a class AB front stage as well as a class AB back stage and still provides efficient, stable and reliable operational up to high frequencies.

It is another object of the present invention to provide a low-voltage multipath-Miller-zero-compensated op amp that has a high slew rate, operates at low-voltages, consumes low power and requires minimal wafer area, and is therefore particularly well-suited for use in micropower applications.

It is yet another object of the present invention to provide a low-voltage multipath-Miller-zero-compensated op amp in which the peaking effect is eliminated.

It is a further object of the present invention to provide a low-voltage multipath-Miller-zero-compensated op amp which has a well controlled settling time and is less sensitive to process and temperature variations.

SUMMARY OF THE INVENTION

These and other objects are achieved by the present invention. According to one embodiment, a low-voltage multipath-miller-zero-compensated (MMZC) operational amplifier is provided for stable operation at high frequencies and low voltages.

Illustratively, the inventive MMZC op amp comprises a class AB front stage and a class AB back stage. The front stage has an inverted input, a non-inverted input, an inverted output, and a non-inverted output. The back stage has an output and an input, which input is connected to the non-inverted output of the front stage. The output of the back stage is connected to the inverted output of the front stage. A capacitor is coupled between the output and in put of the back stage. The inventive low-voltage MMZC op amp may implemented using CMOS transistors.

The front stage may include a differential amplifier which receives inverted and non-inverted inputs. First and second pairs of transistors are connected in a push-pull configuration and provide the inverted and non-inverted outputs of the front stage, respectively.

The back stage may include a pair of transistors connected in a push-pull configuration. The gates of these transistors are connected together to provide the input of the back stage. The drains of the transistors are connected together to provide the output of the back stage.

In another embodiment, the back stage has a pair of differential amplifiers each having an inverted input connected to the non-inverting input of the front stage. The output of the back stage is provided by a pair of push-pull transistors.

The inventive MMZC op amp is a robust op amp which exhibits closed-loop stability at low voltages, provides reliable operation, and consumes low power. The inventive MMZC op amp has a high slew rate. The settling time of the inventive MMZC op amp is less sensitive to load, process and temperature variations.

BRIEF DESCRIPTION OF THE DRAWINGS

FIG. 9b shows one of the dual stages of the conventional class AB op amp shown in FIG. 9a;

DETAILED DESCRIPTION OF THE PREFERRED EMBODIMENTS

Figure 10:
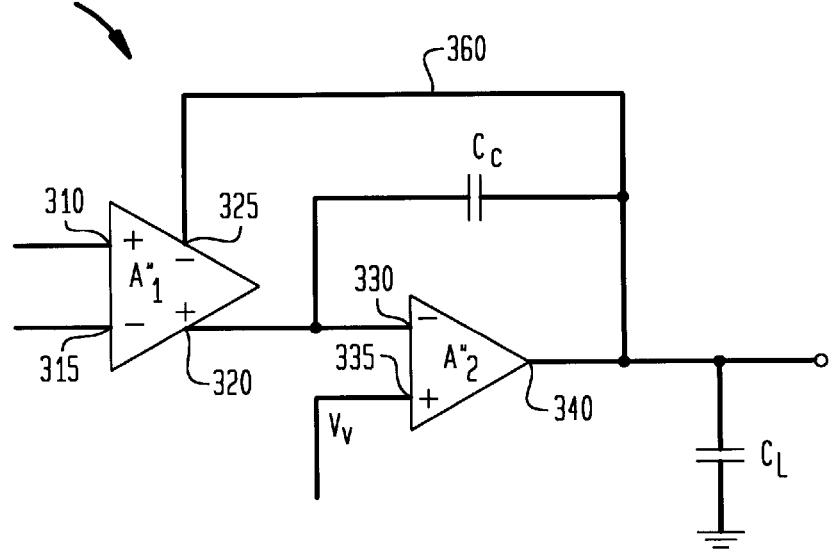
FIG. 10 shows a block diagram of a low-voltage multipath-Miller-zero-compensated operational amplifier according to one embodiment of the present invention.

FIG. 10 shows a block diagram of a low-voltage multipath-Miller-zero-compensated operational amplifier (op amp) 300 according to one embodiment of the present invention. The op amp 300 has a front stage $A''_1$ and a back stage $A''_2$. The front stage $A''_1$ has two inputs and two outputs similar to the front stage $A_1$ of the op amp 100 shown in FIG. 7. The front stage $A''_1$ has a non-inverted input 310, an inverted input 315, a non-inverted output 320 and an inverted output 325. The back stage $A''_2$ has a dual input including an inverted input 330 and a non-inverted input 335. The inverted input 330 is connected to the non-inverted output 320 of the front stage $A''_1$. The voltage $V_r$ at the non-inverted input 335 is maintained at an artificial or "virtual" ground or other appropriate reference voltage.

The output 340 of the back stage $A''_2$ is also the output of the op amp 300.

A load, such as a capacitor $C_L$, is connected between the output 340 and ground. A first feedback loop 350 connects the output 340 of the back stage $A''_2$ to its inverted input 330 through the compensation capacitor $C_c$. Similar to the op amp 100 of FIG. 7, a second feedback loop 360 connects the output 340 of the back stage $A''_2$ to the inverted output 325 of the front stage $A''_1$.

Figure 7:
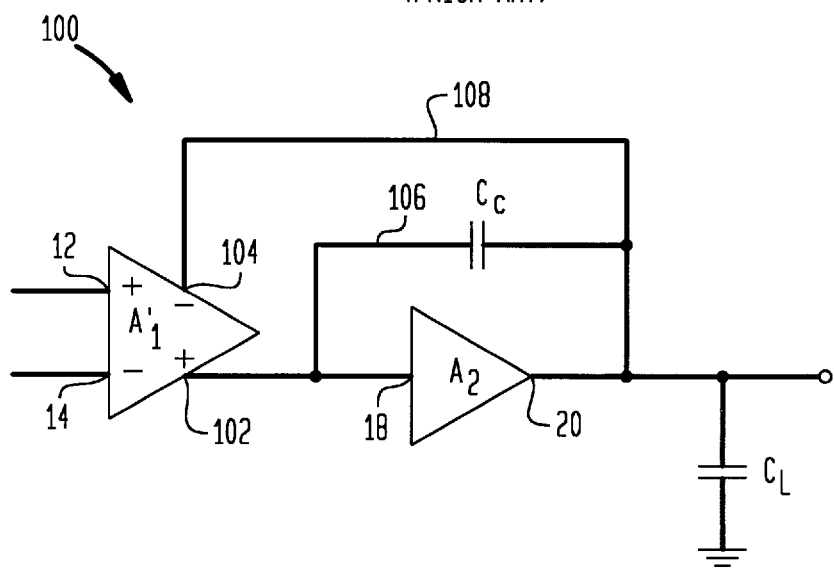
FIG. 7 shows a conventional multipath Miller zero compensated op amp.
Figure 11:
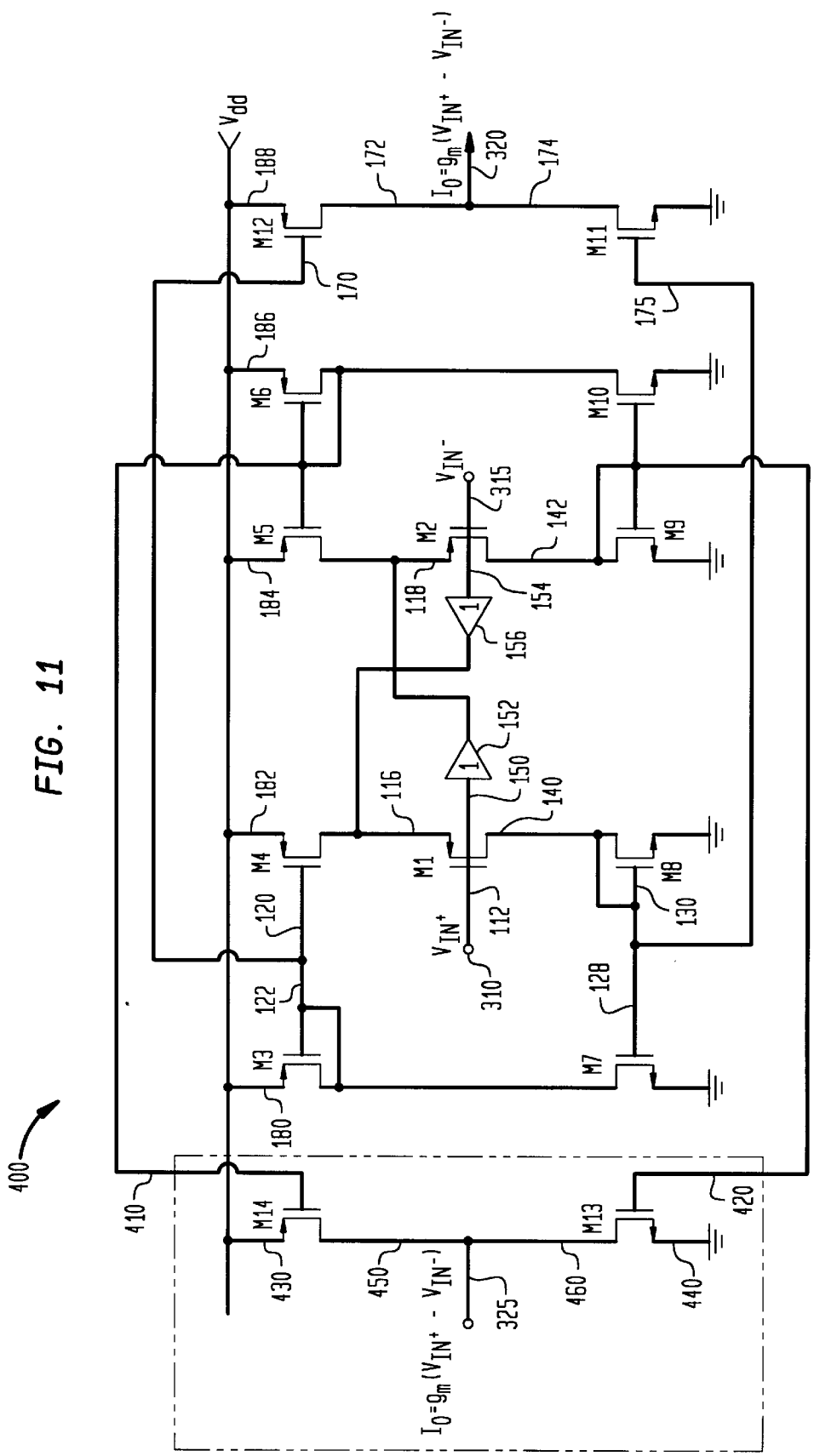
FIG. 11 shows the front stage of the op amp shown in FIG. 10 according to the present invention.

Unlike the front stage $A'_1$ of the op amp 100 shown in FIG. 7, which is implemented using a class A amplifier, the front stage $A''_1$ is a class AB amplifier. FIG. 11 shows one embodiment of the front stage $A''_1$ using a class AB CMOS op amp 400. A portion of the class AB CMOS op amp 400 is similar to the conventional CMOS current op amp 110 shown in FIG. 8. In contrast to the current op amp 110 (FIG. 8), the class AB CMOS op amp 400 has the dual outputs 320, 325 also shown in FIG. 10.

The class AB CMOS op amp 400 has a first low gain stage formed by the CMOS transistors M1–M10 and a second high gain stage formed by the CMOS transistors M11–M14. The first gain stage is a class AB transconductance amplifier which has a differential input pair made of PMOS transistors M1, M2. The gate 112 of M1 is connected to the non-inverted input 310 of the op amp 400 and receives a non-inverted input $V_{in}^+$. The gate 114 of M2 is connected to the inverted input 315 of the op amp 400 and receives a non-inverted input $V_{in}^-$.

As described in connection with FIG. 8, the source 116 of M1 is connected to the current mirror pair made of PMOS transistors M3, M4, and the source 118 of M2 is connected to the PMOS current mirror M5, M6. The drain 140 of M1 is connected to the NMOS current mirror M7, M8, and the drain 142 of M2 is connected to the NMOS current mirror M9, M10.

The gate 112 of M1 is connected to a unity gain buffer amplifier 152 and the gate 114 of M2 is connected to a unity gain buffer amplifier 156. The outputs of the unity gain buffer amplifiers 156, 152 are connected to the sources 116, 118 of M1, M2, respectively.

Two push-pull complementary pairs of CMOS transistors M11, M12 and M13, M14, configured in a class AB arrangement, provide the non-inverted output 320 and inverted output 325 of the class AB CMOS op amp 400, respectively. The two push-pull complementary pairs of CMOS transistors M11, M12 and M13, M14, provide most of the gain of the class AB CMOS op amp 400.

The interconnected gates 120, 122 of the PMOS current mirror M3, M4 are connected to the gate 170 of the PMOS M12. The interconnected gates 128, 130 of the current mirror M7, M8 are connected to the gate 175 of the NMOS M11. The interconnected gates of the PMOS current mirror M5, M6 are connected to the gate 410 of the PMOS M14. The interconnected gates of the NMOS current mirror M9, M10 are connected to the gate 420 of the NMOS M13.

The class AB CMOS op amp 400 is connected between two reference voltages Vdd and Vss. Illustratively, the potential difference between Vdd and Vss is approximately 3 volts. The sources 180, 182, 184, 186 of the PMOS current mirrors M3, M4, and M5, M6, the source 188 of the PMOS M12 and the source 430 of the PMOS M14 are connected to Vdd. The sources 190, 192, 194, 196 of the current mirrors M7, M8, and M9, M10, the source 198 of the PMOS M11, and the source 440 of M13 are connected to Vss, which may be ground.

The drains 172, 174 of M11, M12 are interconnected to provide the non-inverted output 320 of the class AB CMOS op amp 400. At the non-inverted output 320, the class AB CMOS op amp 400 provides the signal $I_o^+ = g_m(V_{in}^+ - V_{in}^-)$. At the inverted output 325, the class AB CMOS op amp 400 provides the signal $I_o^- = -g_m(V_{in}^+ - V_{in}^-)$.

In contrast to the class A folded-architectures disclosed in the Eschauzier references [6], [7], the silicon wafer area needed to implement the class AB CMOS op amp 400 is much smaller than the wafer area needed for class A folded-architectures. The wafer area needed for the op amp 400 is only slightly larger than the wafer area used in the conventional CMOS current op amp 110 shown in FIG. 8, since only two transistors M13, M14 are added. By taking advantage of the current mirror pairs M3–M10 inherent in class AB architecture, it is possible to achieve the dual input and dual output class AB CMOS op amp 400 by adding only two transistors M13, M14 to the conventional CMOS current op amp 110 of FIG. 8.

The voltage gain $A_{v1}$ of the class AB CMOS op amp 400 at its non-inverted output 320 is given by equation (6):

$$A_{v1} = \frac{g_{m11} + g_{m12}}{g_{ds11} + g_{ds12}} \quad (6)$$

where:

$g_{m11}$, $g_{m12}$ are the transconductances of M11 and M12, respectively; and $g_{ds11}$, $g_{ds12}$ are the drain to source conductances of M11 and M12, respectively.

Figure 8:
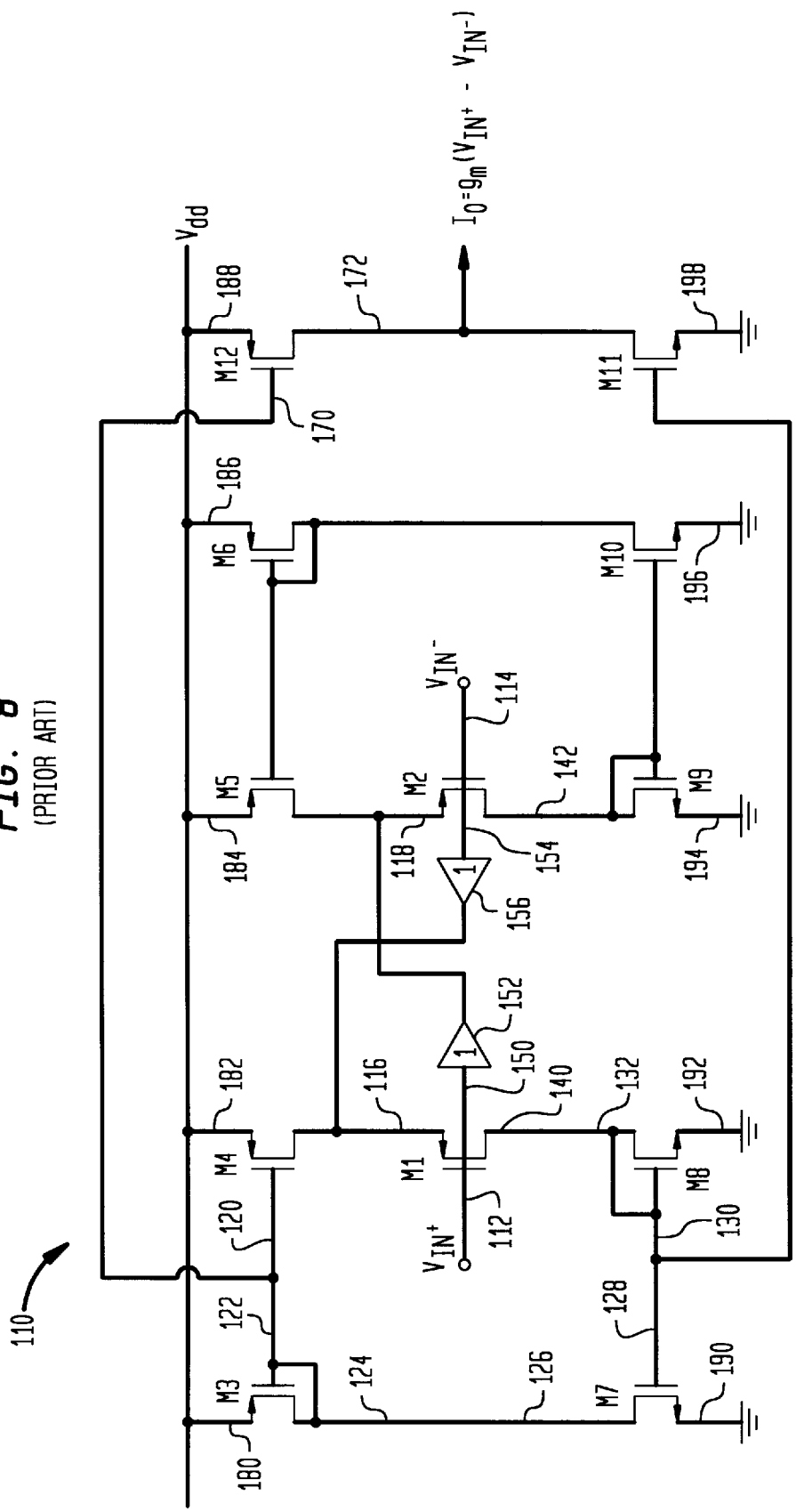
FIG. 8 shows a PMOS implementation of conventional current op amp.
Figure 9A:
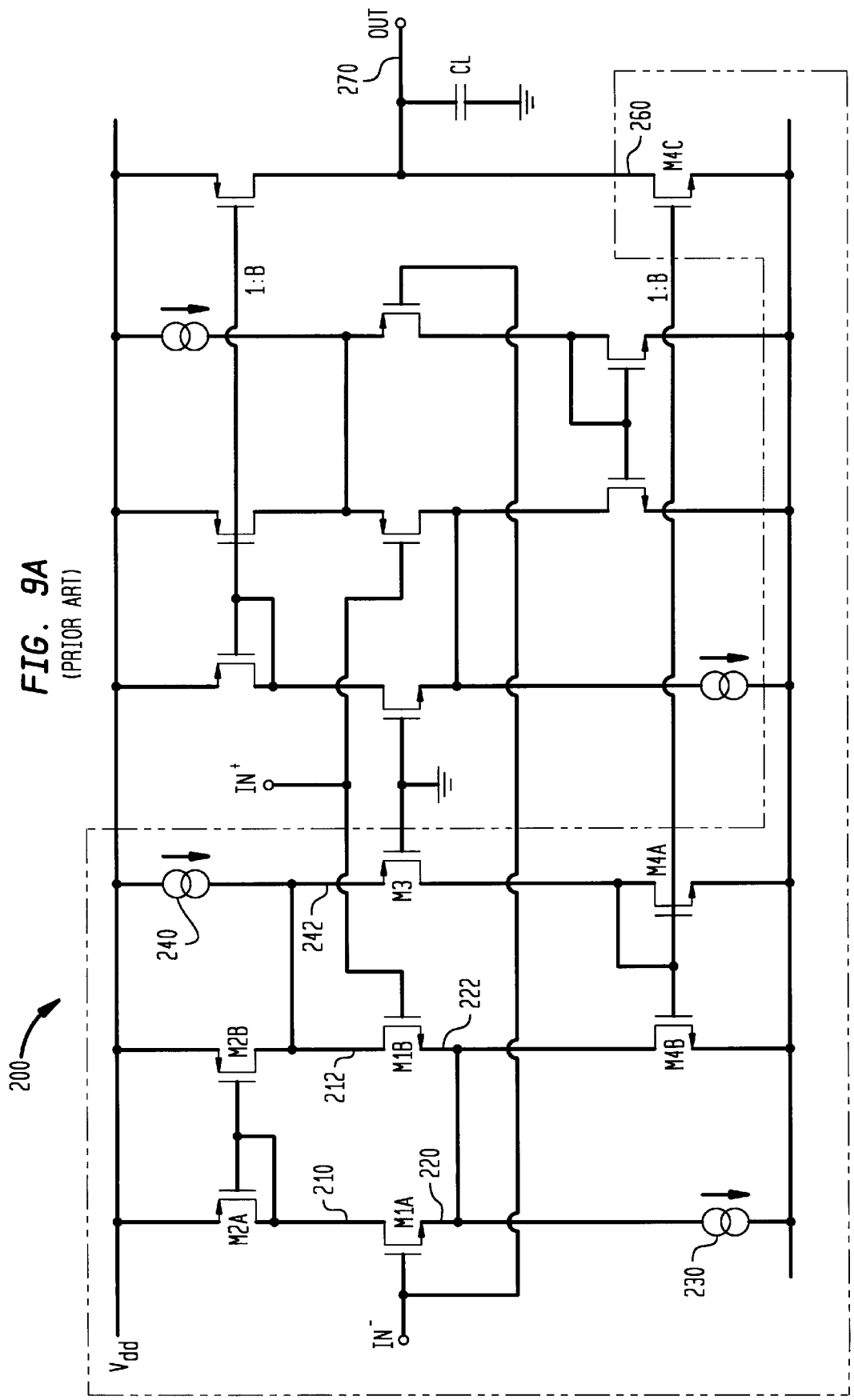
FIG. 9a shows another conventional class AB op amp having a dual stage design.
Figure 9B:
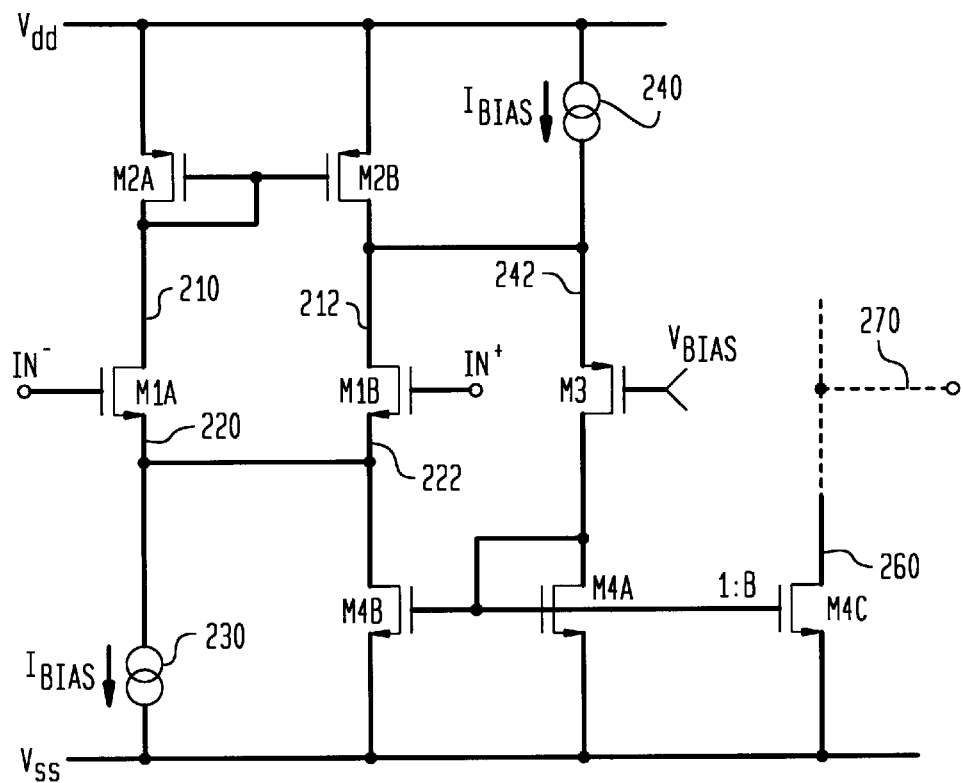

The back stage $A''_2$ of the op amp 300 (FIG. 10) may be implemented using the class AB current op amp 110 of FIG. 8, the class AB transconductance op amp 200 of FIG. 9a, or other suitable implementations described in the above-noted references. Unlike the above-noted references, the present invention utilizes the op amp 110 or op amp 200 as the back stage $A''_2$ of a low-voltage multipath-Miller-zero-compensated op amp such as the op amp 300 shown in FIG. 10.

Comparing the inventive op amp 300 of FIG. 10 to the conventional CMOS current op amp 110 of FIG. 8, and to the multipath technique discussed in the two Eschauzier references [6] and [7], reveals two major differences. One major difference is using the class AB op amp 400 (FIG. 11) as the first stage $A''_1$ (FIG. 10) instead of the class A architecture used in the Eschauzier references [6] and [7]. Another major difference is using the two input class AB transconductance amplifier 200 (FIG. 9a) as the back stage $A''_2$ of the inventive op amp 300 (FIG. 10). In contrast, the back stage of the op amp discussed in reference [6] is a class-A amplifier and the back stage of the op amp discussed in reference [7] is a multi-stage class-AB amplifier.

Figure 12:
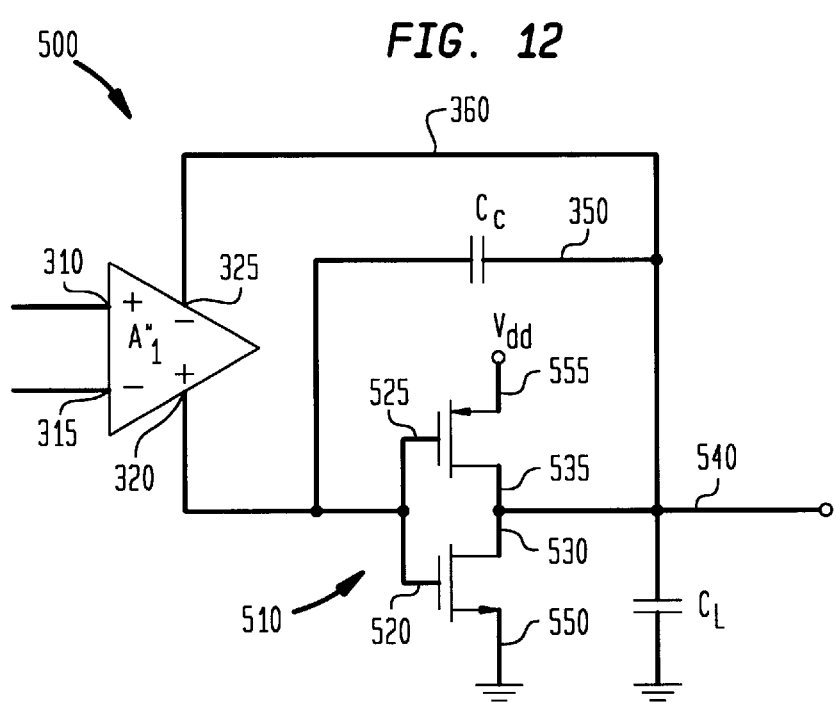
FIG. 12 shows a block diagram of another embodiment of the low-voltage multipath-Miller-zero-compensated operational amplifier according to the present invention.

FIG. 12 shows another embodiment of the present invention. This low-voltage multipath-Miller-zero-compensated op amp 500 uses the same first stage $A''_1$ shown in FIG. 10 and depicted in detail in FIG. 11. However, the second gain stage is implemented using a common-gated CMOS complementary gain stage 510.

The common-gated CMOS complementary gain stage 510 comprises an NMOS transistor M15 and a PMOS transistor M16. The gates 520, 525 of M15, M16 are connected to the non-inverted output 320 of the front stage $A''_1$. The drains 530, 535 of M15, M16 are interconnected to form the output 540 of the op amp 500. The source 550 of M15 is connected to Vss which may be ground. The source 555 of M16 is connected to Vdd.

Similar to the op amp 300 of FIG. 10, a load, such as a capacitor $C_L$, is connected between the output 540 and ground. A first feedback loop 350 connects the output 540 to the non-inverted output 320 of the front stage A"$_1$ through the compensation capacitor C$_c$. A second feedback loop 360 connects the output 540 to the inverted output 325 of the front stage A"$_1$.

The op amp 500 is generally simpler to implement than an op amp 300 (FIG. 10) which uses, for example, the op amp 110 (FIG. 8) or 200 (FIG. 9a) as its back stage A"$_2$. The op amp 500 also requires a smaller wafer area than the op amp 300 (FIG. 10). In addition, the op amp 500 consumes less power and provides less noise on its output 540. However, the power consumption may be excessive when the supply voltage Vdd is increased from 3v to 5v for example. To remedy this, the power consumption may be reduced by using a level shifter having one PMOS transistor and one NMOS transistor to bias the complementary push-pull pair M15, M16.

The op amp 500 has the front stage A"$_1$ connected in cascade to the complementary push-pull pair M15, M16 of gain stage 510. Therefore, the small-signal AC voltage gain A$_v$ of the op amp 500 at its output 540 is given by equation (7):

$$A_v = A_{v1}A_{v2} = \left(\frac{g_{m11} + g_{m12}}{g_{ds11} + g_{ds12}}\right)\left(\frac{g_{m15} + g_{m16}}{g_{ds15} + g_{ds16}}\right) \quad (7)$$

where:

$g_{m11}, g_{m12}, g_{m15}, g_{m16}$ are the transconductances of M11, M12, M15 and M16, respectively; and $g_{ds11}, g_{ds12}, g_{ds15}, g_{ds16}$ are the drain to source conductances of M11 M12, M15 and M16, respectively.

Figure 1:
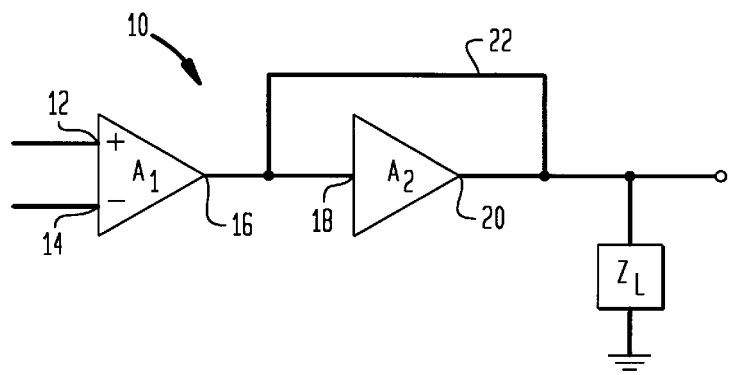
FIG. 1 shows a block diagram of a conventional two stage op amp.
Figure 2A:
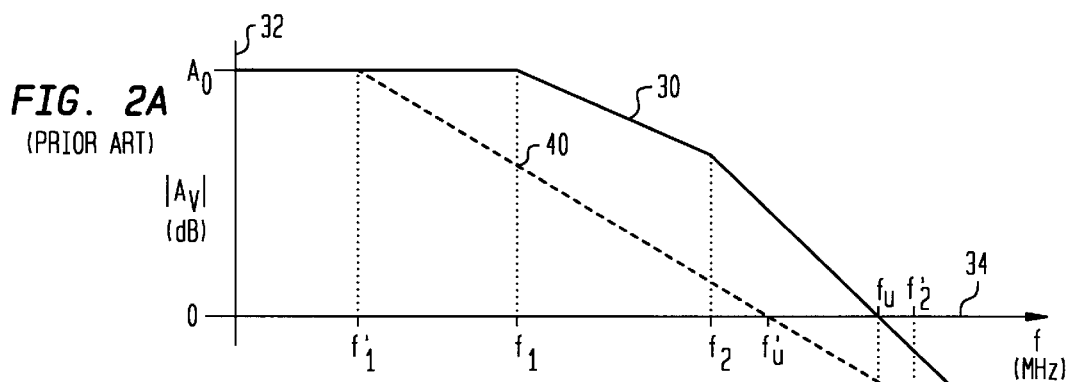
FIGS. 2a, 2b show Bode plots of conventional uncompensated and compensated op amps.
Figure 2B:
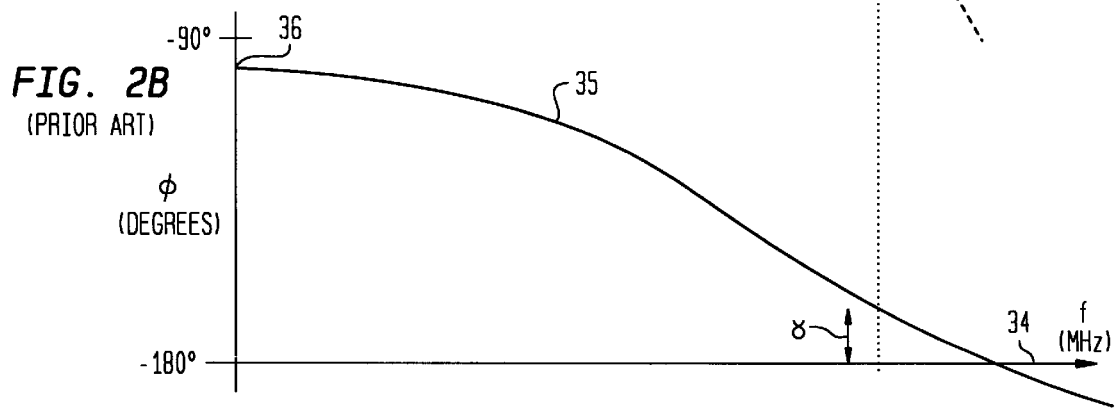
Figure 3:
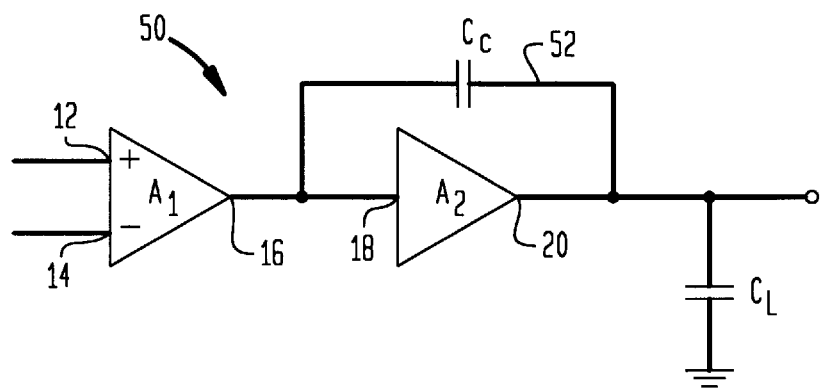
FIG. 3 shows a conventional single-capacitor Miller compensated op amp.
Figure 4:
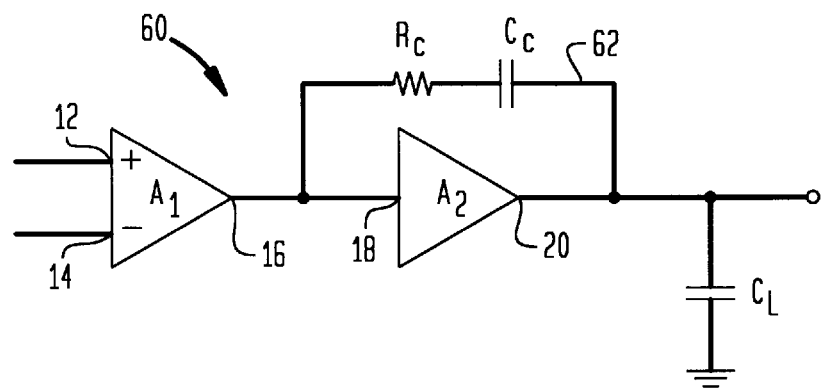
FIG. 4 shows a conventional $R_c$ Miller compensated op amp.
Figure 5:
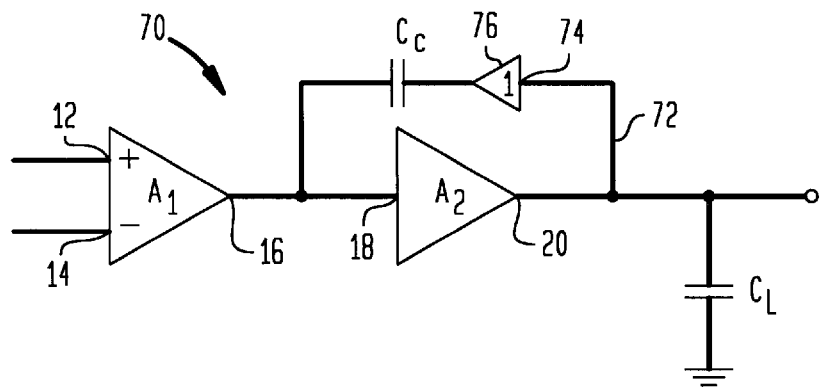
FIG. 5 shows a conventional unity-gain buffer compensated op amp.
Figure 6:
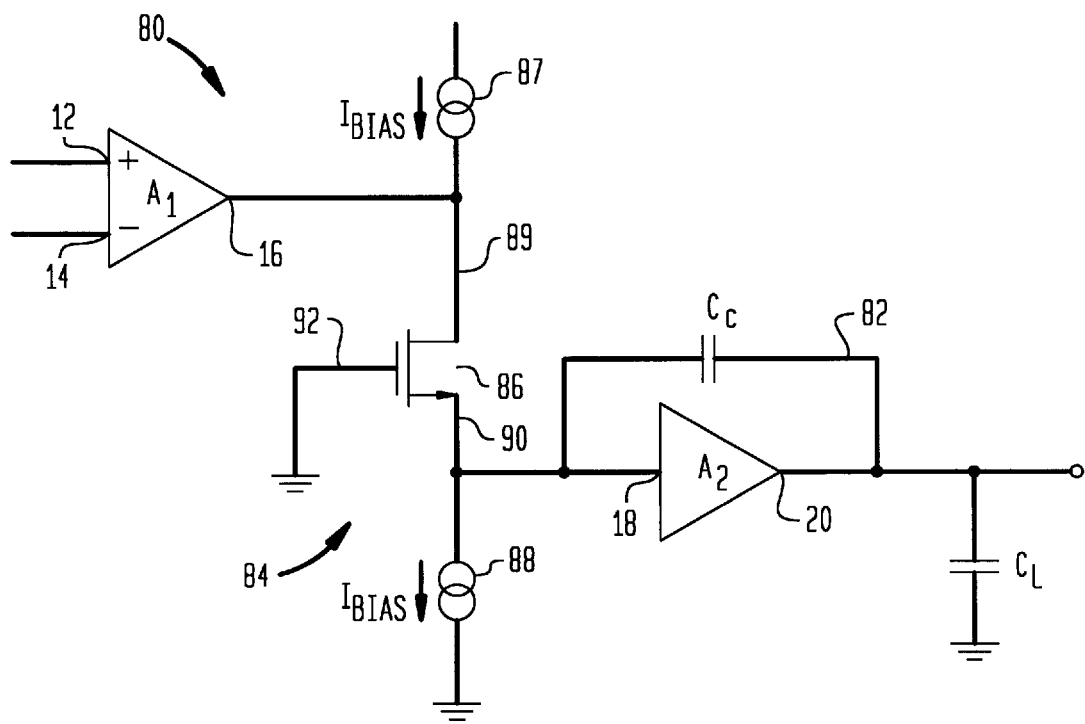
FIG. 6 shows a conventional current buffer compensated op amp.

Table 1 shows the characteristics of exemplary implementations of the inventive op amps 300 and 500 (shown in FIGS. 10, 12, respectively), as compared with the characteristics of an op amp based on the conventional RC compensated Miller op amp architecture (shown in FIG. 4).

TABLE 1

|  | Inventive Op amp 300 (FIG. 10) | Inventive Op amp 500 (FIG. 12) | Conventional Op amp 60 (FIG. 4) |
| --- | --- | --- | --- |
| Gain | 74 dB | 74 dB | 74 dB |
| Unity Gain Bandwidth | 3.94 MHz | 3.71 MHz | 4.5 MHz |
| Phase Margin | 57.2° | 55.2° | 75° |
| Slew Rate | 15 v/µs | 15 v/µs | 15 v/µs |
| Settling Time | 325 ns | 415 ns | 280 ns |
| Settling Time Increase For 20% Mismatch in C$_c$ | 20 ns | 23 ns | 80 ns |
| Power Consumption | 1.87 mw | 1.3 mw | 1.85 mw |
| Load | 20 pF | 20 pF | 20 pF |
| Compensation Capacitor | 8 pF | 8 pF | 8 pF |
| Supply Voltage | 3 v | 3 v | 3 v |

As can be seen from Table 1, the phase margin of the conventional RC Miller-Compensated op amp 60 (FIG. 4) is 75° which is better than the phase margins 57.2°, 55.2° of the inventive op amps 300 (FIG. 10) and 500 (FIG. 12), respectively. This is expected and is due to the zero placement over the second LHP pole. In practice, the values of R$_c$, C$_c$ and gm of the transistors used to implement the conventional op amp 60 (FIG. 4) change due to process and temperature variations. This separates the zero from the second LHP pole thus degrading the performance of the conventional op amp 60 architecture (FIG. 4).

Intentional mismatch of the compensation capacitor C$_c$ of the op amps 60, 300, 500 by 20% yielded an increase in the settling time as follows:

80 ns increase for the conventional op amp 60;
20 ns increase for the inventive op amp 300; and
23 ns increase for the inventive op amp 500.

The above variations demonstrate that the settling times of the inventive op amps 300, 500 are less sensitive than the settling time of the conventional RC-Miller Compensated op amp 60 architecture. The effect will generally be even more pronounced when temperature is taken into consideration. Although the settling time sensitivity of the op amp 60 architecture can usually be minimized at the expense of reducing phase margin by shifting the RHP zero to infinity, the heterogeneous structures used to implement R$_c$, C$_c$ and gm generally cannot track each other over process and temperature variations.

Figure 13:
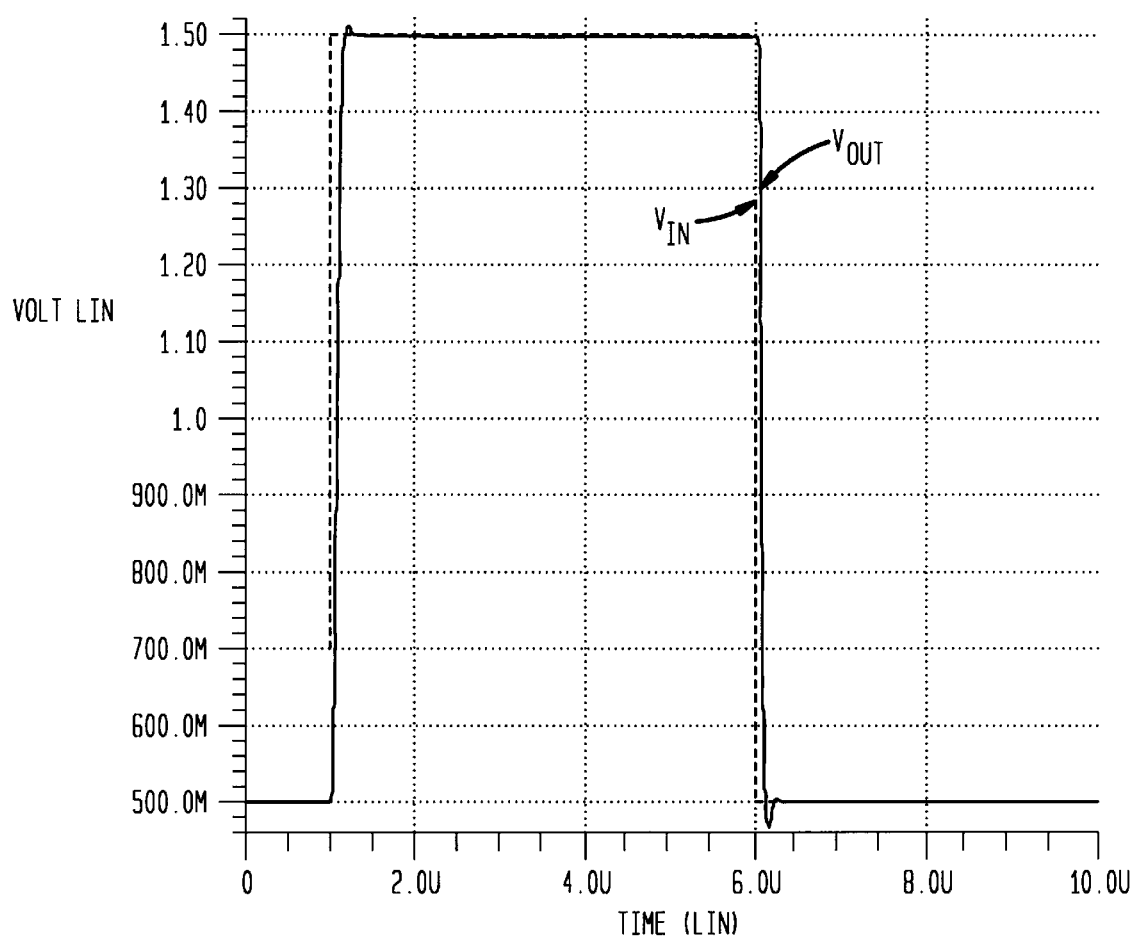
FIG. 13 shows a large-signal transient response of the low-voltage multipath-Miller-zero-compensated operational amplifier shown in FIG. 10 according to the present invention.
Figure 14:
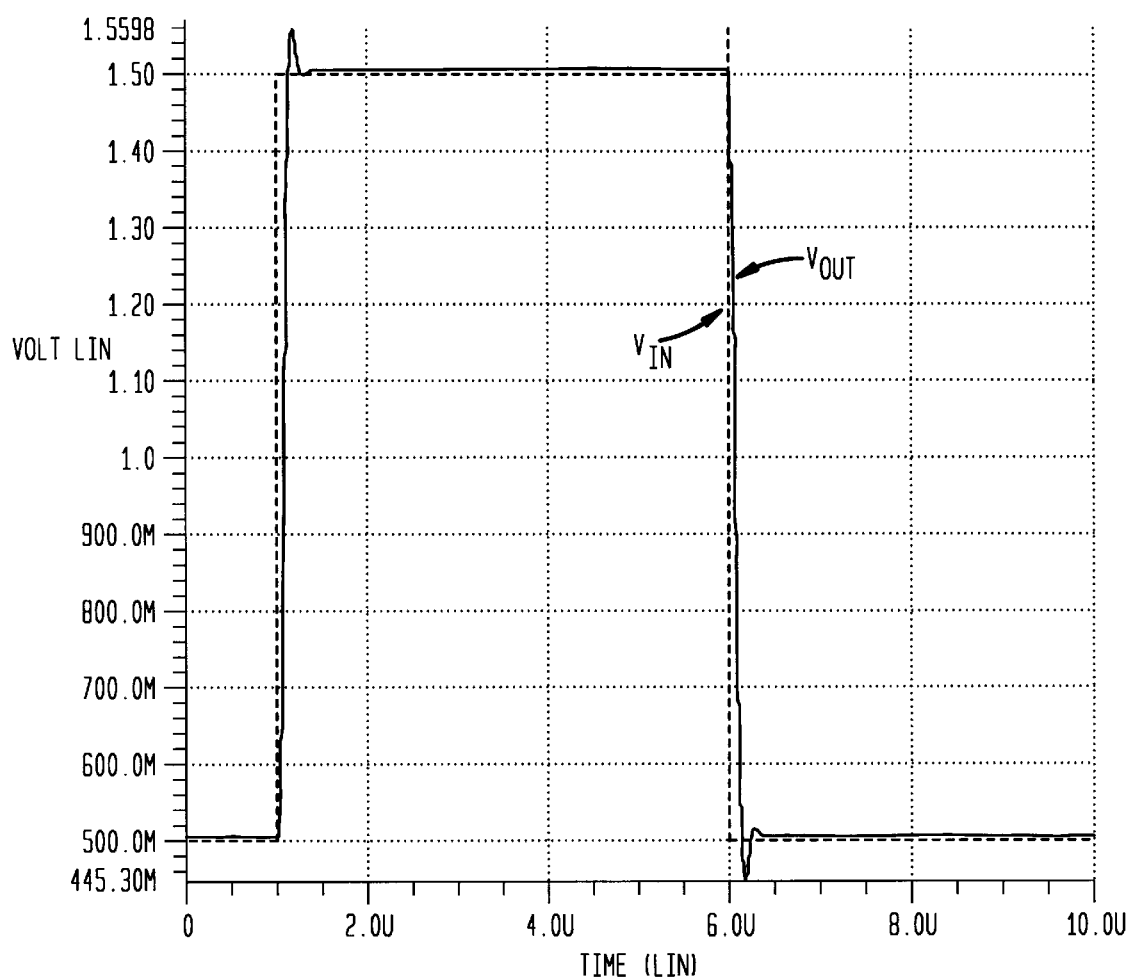
FIG. 14 shows a large-signal transient response of the low-voltage multipath-Miller-zero-compensated operational amplifier shown in FIG. 12 according to the present invention.

FIGS. 13, 14 show large-signal transient responses of the inventive low-voltage multipath-Miller-zero-compensated op amp 300 (FIG. 10) and op amp 500 (FIG. 12), respectively. The vertical axis represents voltage in volts (v) and millivolts (mv), while the horizontal axis represents time in micro-seconds (µs). The input voltage V$_{in}$ is shown in dashed lines and the output voltage V$_{out}$ is shown in solid lines. As can be seen from FIGS. 13, 14, the inventive op amps 300 (FIG. 10) and 500 (FIG. 12) have a high slew rate. This allows the output voltage V$_{out}$ to closely follow the input voltage V$_{in}$ with minimum distortion.

Figure 15A:
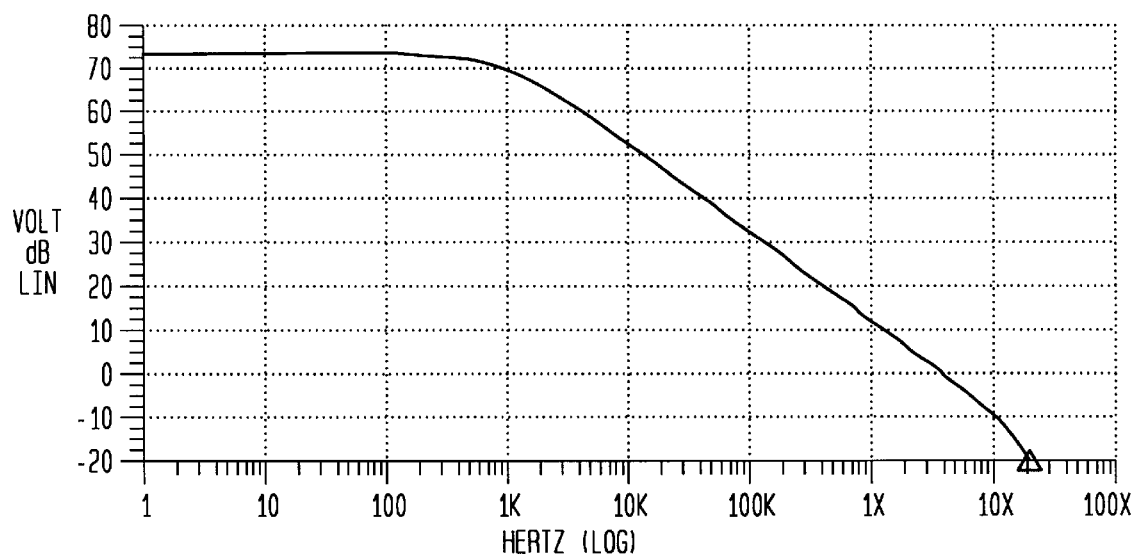
FIGS. 15a–15b show a Bode plot of the low-voltage multipath-Miller-zero-compensated operational amplifier shown in FIG. 10 according to the present invention.
Figure 15B:
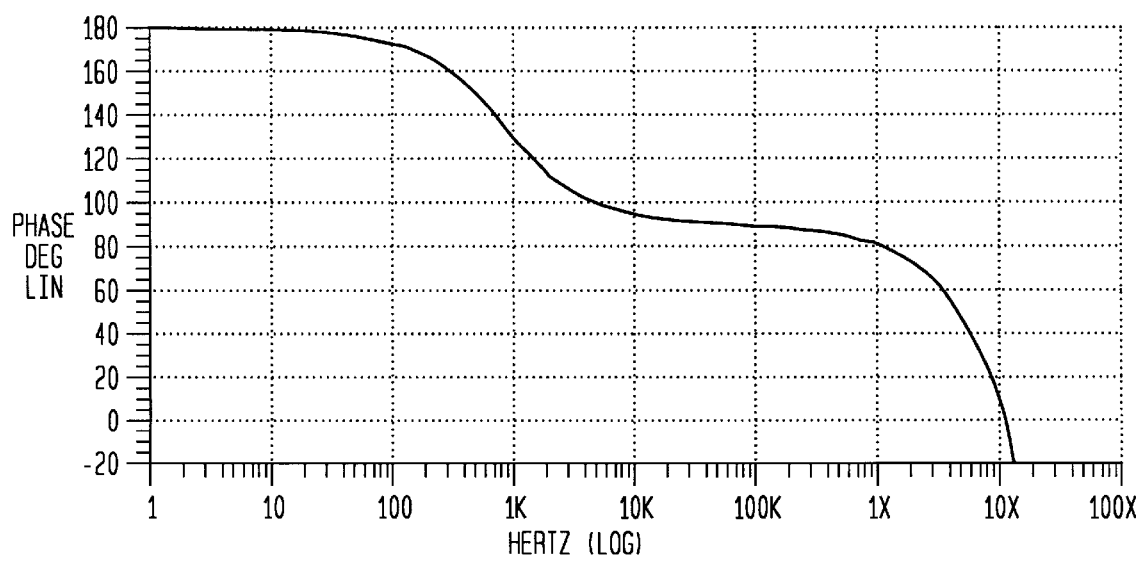
Figure 16A:
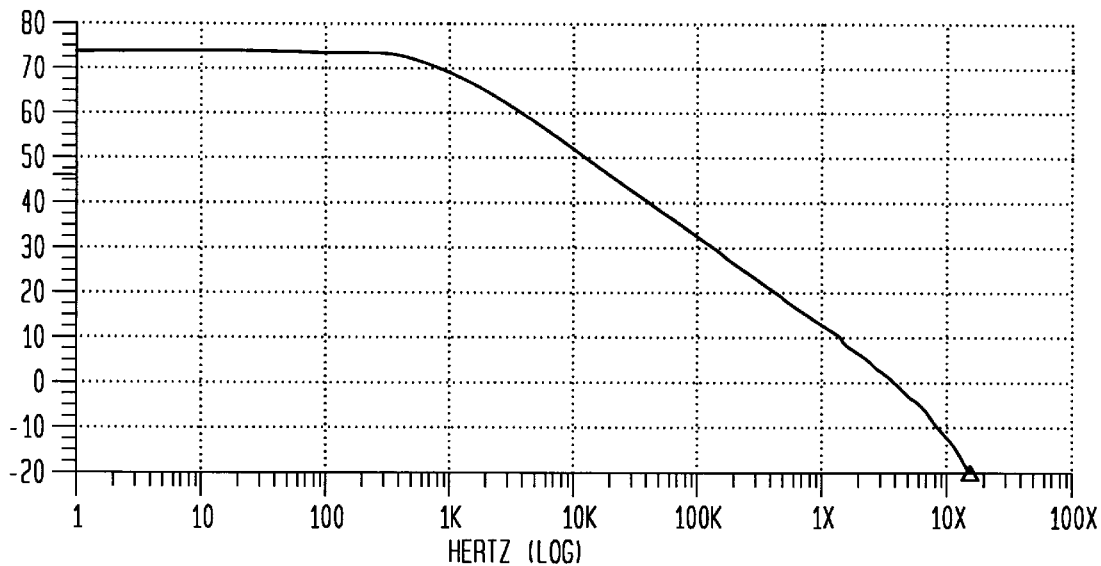
FIGS. 16a–16b show a Bode plot of the low-voltage multipath-Miller-zero-compensated operational amplifier shown in FIG. 12 according to the present invention.
Figure 16B:
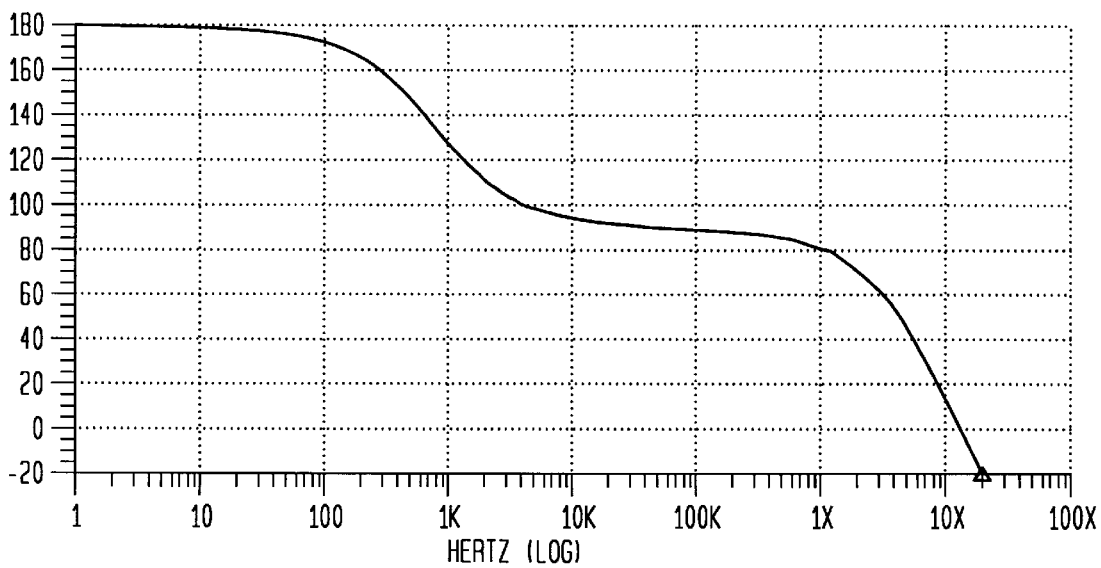

FIGS. 15a–15b show a Bode plot of the inventive low-voltage multipath-Miller-zero-compensated op amp 300 (FIG. 10). FIGS. 16a–16b show a Bode plot of the inventive low-voltage multipath-Miller-zero-compensated op amp 500 (FIG. 12). The voltage gain in dB is the vertical axis of FIGS. 15a, 16a, while the phase in degrees is the vertical axis of FIGS. 15b, 16b. The horizontal axis of FIGS. 15a–16b is the log of frequency in hertz (Hz). As can be seen from the frequency responses shown in FIG. 15a–16b, there is no peaking effect.

In summary, a multipath-Miller-zero-compensated (MMZC) op amp is disclosed which is based on the cascade of a front stage and a back gain stage in association with a multipath-miller zero compensation technique. The front stage is a modified class-AB transconductance amplifier. In one embodiment, the back gain stage is a common-gated CMOS push-pull pair which enables the op amp to drive heavy loads efficiently.

Unlike conventional low-voltage class-AB amplifier designs using a class-A front-end stage, the modified class-AB transconductance amplifier used as the front stage of the inventive MMZC op amp has high slew rate performance at low power conditions. In addition, the modified class-AB transconductance amplifier requires minimum silicon wafer area.

The inventive multipath-Miller-zero-compensated (MMZC) op amp, which uses a class AB front stage and a class AB back gain stage, is a high performance robust op amp with many advantages and desirable characteristics. For example, the inventive MMZC op amp provides stable, reliable and efficient operation at low voltages. The inventive MMZC op amp has high closed-loop stability due to the absence of a RHP zero. This feature is particularly important in, for example, micropower applications in which a finite current flow in an amplification stage may not shift the RHP zero sufficiently far away to avoid significant phase deterioration.

The inventive MMZC op amp has a high slew rate, even at low power conditions, thus minimizing output distortion. The settling time of the inventive MMZC op amp is less sensitive to process, load and temperature variations. Thus, larger load mismatches do not detrimentally affect the proper operation of the inventive MMZC op amp.

In addition, the inventive MMZC op amp consumes low power. This reduces loading of a power supply or a battery. The inventive MMZC op amp also eliminates the above-described peaking effect.

The inventive MMZC op amp has a reduced size and requires minimal wafer area. This allows use of the inventive MMZC op amp in miniaturized devices. The inventive MMZC op amp may be used in various low voltage, low power signal processing applications, such as switched-capacitor filters, continuous-time filters, sample and hold circuits, microwave medical applications and general purpose amplification, etc.

The above described embodiments of the invention are intended to be illustrative only. Numerous alternative embodiments may be devised by those skilled in the art without departing from the spirit and scope of the following claims.

The claimed invention is:

1. A multipath-miller-zero-compensated operational amplifier comprising:

a class AB front stage having an inverted input, a non-inverted input, an inverted output, and a non-inverted output;

a class AB back stage having an output and an input, wherein the input of the back stage is connected to the non-inverted output of the front stage, and wherein the output of the back stage is connected to the inverted output of the front stage; and a feedback element coupled between the output and the input of the back stage.

2. The amplifier of claim 1, wherein the feedback element is a capacitor.

3. The amplifier of claim 1, wherein the back stage comprises a pair of transistors arranged in a push-pull configuration, gates of said transistors being connected to the non-inverting output of the front stage, and drains of said transistors being connected to the output of the back stage.

4. The amplifier of claim 1, wherein the back stage comprises a pair of transistors having gates and drains, said gates being connected together to provide the input of the back stage, and said drains being connected together to provide the output of the back stage.

5. The amplifier of claim 1, wherein the back stage further has a non-inverted input which acts as virtual ground.

6. The amplifier of claim 1, wherein the back stage further has a non-inverted input which is connected to a reference voltage.

7. The amplifier of claim 1, wherein the operational amplifier is coupled between a first power supply and a second power supply.

8. The amplifier of claim 7, wherein the first power supply provides approximately 3 volts, and the second power supply provides approximately 0 volts.

9. The amplifier of claim 1, wherein the front stage comprises:

an input differential amplifier connected to the inverting and non-inverting inputs of the front stage; and a first and second pair of transistors arranged in a push-pull configuration and connected to the inverting and non-inverting outputs of the front stage.

10. The amplifier of claim 9, wherein the input differential amplifier and the transistors are CMOS devices.

11. The amplifier of claim 1, wherein the back stage comprises:

a pair of differential amplifiers each having an inverted input connected to the non-inverting output of the front stage; and a pair of push-pull transistors connected to the output of the back stage.

* * * * *